United States Patent [19]

Gernot et al.

[11] 4,045,707

[45] Aug. 30, 1977

[54] SYSTEM FOR THE POWER CONTROL OF HIGH VOLTAGE ELECTRON BEAM GENERATORS

[75] Inventors: Thorn Gernot, Hanau am Main; Thomas Friedric-Wilhelm, Niedermittlau, both of Germany

[73] Assignee: Leybold-Heraeus GmbH & Co. KG, Cologne, Germany

[21] Appl. No.: 671,631

[22] Filed: Mar. 29, 1976

[30] Foreign Application Priority Data

Apr. 4, 1975 Germany .............................. 2514805

[51] Int. Cl.$^2$ ...................... H05B 7/02; H01J 37/30; B23K 15/00
[52] U.S. Cl. .............................. 315/106; 219/121 EB; 315/107; 315/291; 315/307
[58] Field of Search ............... 315/106, 107, 291, 307; 219/121 EB; 250/492 R

[56] References Cited

U.S. PATENT DOCUMENTS

| | | | |
|---|---|---|---|
| 3,376,473 | 4/1968 | Oku | 315/291 |
| 3,689,798 | 9/1972 | Brukovsky et al. | 315/106 |
| 3,909,663 | 9/1975 | Thomas et al. | 315/307 X |

*Primary Examiner*—Eugene R. La Roche
*Attorney, Agent, or Firm*—Burgess, Dinklage & Sprung

[57] ABSTRACT

System for the power control of high voltage electron beam generators having a cathode and a control electrode associated with the cathode. The system is provided with a high voltage isolation transformer with primary and secondary winding for supplying the control electrode with a control voltage. A system precedes the isolation transformer on the primary side and is adapted to generate square wave pulses susceptible of amplitude modulation. The pulse generator is designed such that the pulses are square wave impulses symmetrical with the null line. The isolation transformer is provided with a tertiary winding on the primary side and the primary winding receives input from an amplifier whose input is connected with the output voltage of the tertiary winding. A rectifier bridge is connected to the secondary winding.

2 Claims, 1 Drawing Figure

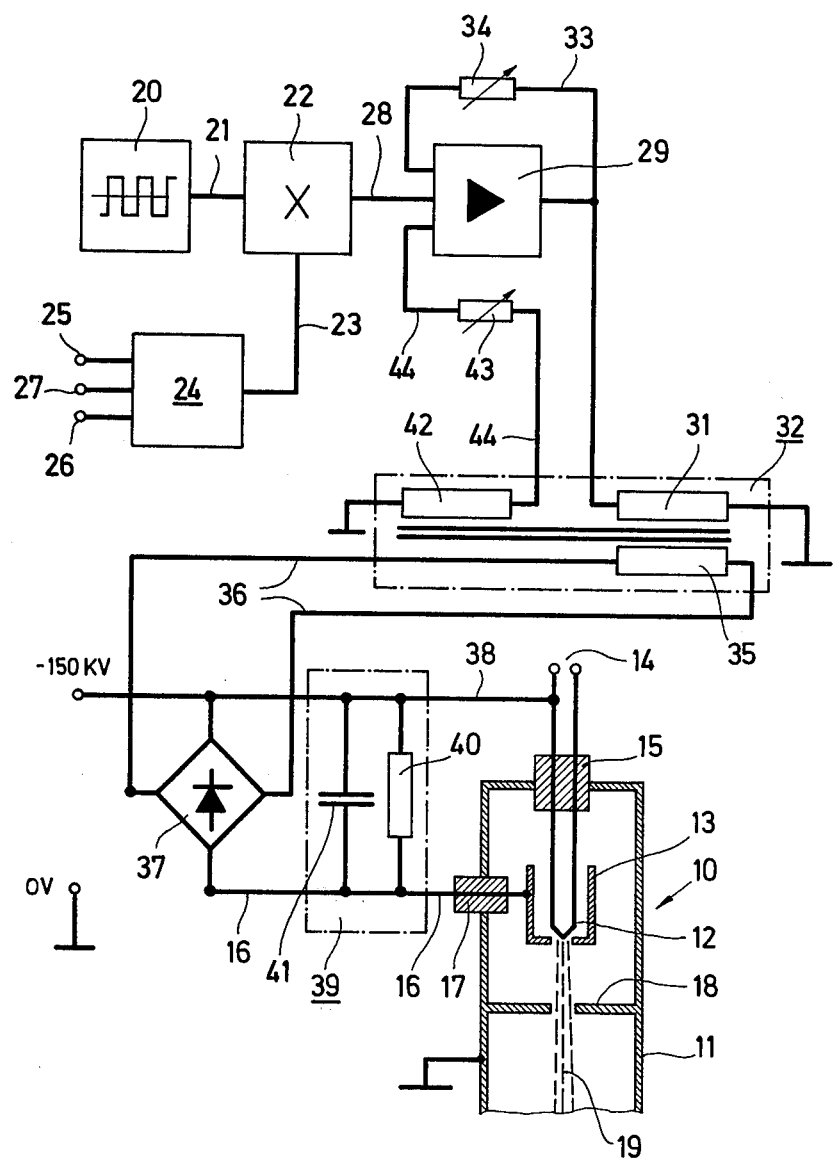

SYSTEM FOR THE POWER CONTROL OF HIGH VOLTAGE ELECTRON BEAM GENERATORS

BACKGROUND

The invention relates to a system for the power control of high voltage electron beam generators having a cathode and a control electrode associated with the cathode, said system consisting of a high voltage isolation transformer with primary and secondary winding to supply the control electrode with a control voltage, and having a device connected to the primary side of the isolation transformer for the production of square-wave pulses susceptible of amplitude modulation.

Electron beam generators of the above described kind are used in many fields of technology, but principally for the melting, welding, machining and vaporization of materials of all kinds, preferably under a vacuum. For the purpose of varying the intensity of an electron beam, the heating power of the incandescent cathode, the bias voltage of the control electrode, and/or the applied acceleration voltage can be varied.

In high voltage electron beam generators, which are generally operated at an anode voltage above 20 kilovolts and which therefore have a relatively low beam current at a given output power, there is provided in the vicinity of the cathode a cylindrical control electrode which is often referred to also as a Wehnelt cylinder. With this electrode it is possible to vary the beam current between 0 and 100%. For this purpose, a voltage of variable amplitude which is negative in relation to the cathode is applied to the control electrode and suppresses the emergence of the electrons in the direction of the anode to a greater or lesser degree according to the magnitude of this control voltage. The voltage level for the secure blocking of the electron beam generator is several kilovolts depending on the construction of the control electrode. The maximum beam current is achieved when the cathode and control electrode are at the same potential.

German "Auslegeschrift" 1,131,760 has previously disclosed a system of the kind described above, in which the control electrode is periodically fed with impulses which are superimposed upon a direct current bias voltage. This is intended to cause the electron beam to be turned on intermittently. What is involved, therefore, is a constant turning on and off of an electron beam of always constant power, the power level being, of course, variable. The power can also be controlled in this case by the relative time of operation of the electron beam. In the known system, however, no direct current component of the control voltage is transferred to the control electrode on account of the isolation transformer that is present, so that no continuous control of the power of the electron beam generator is possible.

Continuous power control, however, is necessary for a number of purposes, such as, for example, for increasing the power in electron beam welding at the beginning and at the end of a seam, in the welding of workpieces of different material thicknesses, etc. The impulse frequency, furthermore, cannot be lower than about 50 to 100 Hz on account of the band width of the isolation transformer. But, in particular, the known system does not permit a distortion-free transfer of the impulses through the isolation transformer at the lower end of the band of frequencies to be transmitted. Instead, on the secondary side, a "tilt" will occur, which will increase as the length of the pulses increases, even though perfect square wave pulses are put into the primary side of the isolation transformer. The reason for this is the dynamic behavior of the magnetic coupling of the two circuits within the transformer. The source of the difficulty is thus a basically unavoidable property of magnetically coupled circuits.

THE INVENTION

The invention is addressed to the problem of devising a circuit for the continuous, or, as one chooses, the pulse-like control of the power of a high voltage electron beam generator, in which the control signals can be transferred through an isolating transformer without distortion, such that there will be no need for active components such as transistors or tubes or for auxiliary voltages on the high voltage side of the transformer.

The solution of this problem is accomplished by the invention in that the pulse generator is designed such that the isolation transformer is provided on the primary side with a tertiary winding, that the primary winding receives its input from an amplifier to whose input is connected the output voltage of the tertiary winding, and that a rectifier bridge is connected to the secondary winding.

The connection of the output voltage of the tertiary winding to the amplifier causes the shape of the pulse on the primary side to be affected such that the voltage on the secondary side and on the tertiary winding will correspond precisely to the desired square wave voltage. This is because the tertiary winding serves to provide a voltage signal which corresponds to the one on the secondary side of the transformer. By a comparison of this voltage with the given square wave signal, an appropriate amplification will produce a regulating action that will change the shape of the curve of the primary voltage in the sense indicated above. In this manner a square wave voltage is produced on the secondary side, which is transformed in a full-wave rectifier to a direct current voltage. The direct current voltage thus produced will consist of a plurality of concatenated square waves and can be used generally without further smoothing for the control of the electron beam generator. The envelope curve of the concatenated square waves will correspond in that case to the actual control signal or control voltage, as the case may be.

The designing of the pulse generator in such a manner that the pulses will be square wave pulses symmetrical with the null line has the purpose of making the individual pulses succeed one another with no gaps between then, in contrast to the state of the art. The use of the rectifier bridge brings it about that the pulses appearing on the secondary side of the transformer and having alternating positive and negative polarity will be transformed to the uninterrupted chain of pulses of equal polarity.

By the system of the invention, active components such as transistors and tubes, and the use of auxiliary voltages on the high-voltage side, are rendered unnecessary. The size of the shielded housing which is needed to contain the control system and which must be at the cathode potential becomes minimal. This is an advantage which is not to be underestimated, because often there is not enough space available for the housing of electrical parts.

The square wave pulses supplied by the pulse generator are best multiplied, prior to their input into the amplifier, by a value which is obtained in a logic circuit by comparison of the actual value with the prescribed value. This will result in an amplitude-modulated carrier frequency which is recovered entirely without distortion on the high voltage side of the isolation transformer in the manner described above, and, after rectification, forms the control voltage for the cylindrical control electrode. The steepness of the flanks of the individual pulses will be virtually the same as that of the flanks of the square wave pulses on the primary side.

The system of the invention permits not only a continuous control of the power of a high voltage electron beam generator, but also, at the user's option, a pulselike control, if, for example, in the case of electron beam welding, pulse operation is required, the transfer of both continuous pulses and single pulses taking place entirely without distortion. The control signal produced will generally contain no ripple as it would in other forms of signal transfer. As a rule, smoothing devices can be dispensed with. Only when it is a matter of clipping off switching transients, for example, may an RC circuit of short time constant be arranged parallel to the rectifier bridge in further development of the invention.

An example of the embodiment of the system of the invention and the manner in which it operates will now be explained with the aid of the drawing.

In the drawing, 10 designates a high voltage electron beam generator or gun consisting of a housing at mass potential 11, a cathod (incandescent cathode) 12 and a control electrode (Wehnelt cylinder) 13. The cathode 12 is supplied with a heating current through the terminals 14, the cathode leads being brought into the housing 11 through a lead-through insulator 15. The lead 16 of the control electrode 13 is brought into the housing 11 through another lead-through insulator 17. An accelerating anode 18 is a part of the housing. On the basis of the arrangement thus represented—which is known— an electron beam 19 is formed when the voltages are applied, and this beam can be used for the purposes described in the beginning.

The power control system has a pulse generator 20 which is constructed such that the pulses are square wave pulses of constant amplitude and constant frequency which are symmetrical with the null line. The frequency will be, for example 10 kHz. The output of the pulse generator is delivered through a conductor 21 to a multiplier 22 which receives through line 23 a direct-current signal which is supplied by a logic circuit 24. At a terminal 25 the logic circuit is supplied with a standard voltage provided through a potentiometer, while the actual value of the beam current is applied to an input terminal 26. The value of the beam current is detected by one of the conventional methods and is not represented in detail in the drawing. Standard voltages from external function generators can be applied optionally to the input terminal 27. The comparing of the voltages in the logic circuit 24 will result in the production of a varying or unvarying voltage signal which will form the later envelope curve for the pulse train. In the multiplier 22 an amplitude modulated control signal is formed which is delivered through a line 28 to an amplifier 29. The level of the square wave voltage on line 28 will always be so great that the standard current and the actual current of the beam will be the same. In the amplifier 29 the necessary power is produced, which is delivered to the primary winding 31 of an isolating transformer. A feedback line 33 with a rheostat 34 serves to establish the degree of amplification of the amplifier 29.

The isolation transformer 32 has a secondary winding which is connected by lines 36 to a rectifier bridge 37 in which the output pulses of the isolation transformer 32 are rectified, whereupon, due to the design of the pulse generator 20, a gap-less series, or concatenation, of pulses is formed, whose envelopes curve corresponds to the output signal of the logic circuit 24. The output signal from the rectifier bridge 37 is connected by the line 16 and an additional line 38 to the control electrode 13 on the one hand and to the cathode 12 on the other. Parallel with the rectifier bridge 37 there is connected an RC circuit 39 consisting of an ohmic resistance 40 and a condenser 41. The condenser 41 serves only for clipping switching transient peaks, while the resistance 40 brings it about that the control voltage for the control electrode 13 of the beam generator will be produced with a low internal resistance, thereby preventing the electrostatic charging of the control electrode 13. The isolation transformer 32 additionally has a tertiary winding 42 which is disposed together with the primary winding 31 on the primary side of the transformer. The output voltage of the tertiary winding 42 is also connected to the amplifier 29 through a variable resistance 43 and a line 44. The feedback thus formed serves, in conjunction with the tertiary winding 42, to transmit the true shape of the square wave voltage delivered through the line 28. Without this feedback, a square wave pulse on the primary side would result in a tilt in the pulse on the secondary side of the transformer. The tertiary winding serves to produce a voltage similar to the one which occurs on the secondary side of the transformer. By a comparison of this voltage with the pulses delivered through line 28, a regulating action is performed by the amplifier 29, which affects the shape of the curve of the primary voltage in the isolation transformer 32 such that the voltage on the tertiary winding will correspond precisely to the pulse voltage in line 28. In this manner as identical voltage curve is also produced on the secondary side, which is transformed in the bridge rectifier 37 into a direct current voltage which can be interpreted as an envelope curve of gap-lessly concatenated individual pulses. The voltage signal corresponding to the envelope curve serves for the operation of the control electrode 13, as described above.

What is claimed is:

1. System for the power control of high voltage electron beam generators comprising a directly heated cathode and a control electrode associated with the cathode, said system having high voltage isolation transformer means with primary and secondary winding for supplying the control electrode with a control voltage, means preceding the isolation transformer means on the primary side for the generation of square wave pulses symmetrical with the null line, means responsive to the comparison of the actual beam current and a reference value for amplitude modulating the square wave pulses, said isolation transformer means being provided with a tertiary winding on the primary side, said primary winding receiving input from the output of amplifier means having one input connected with the output voltage of the tertiary winding and another input receptive of the modulated square wave pulses and rectifier bridge means connected across the secondary winding.

2. System of claim 1 wherein an RC circuit of short time constant is disposed parallel to the output of the rectifier bridge means.

* * * * *